United States Patent
Horak et al.

(10) Patent No.: US 6,890,828 B2
(45) Date of Patent: May 10, 2005

(54) METHOD FOR SUPPORTING A BOND PAD IN A MULTILEVEL INTERCONNECT STRUCTURE AND SUPPORT STRUCTURE FORMED THEREBY

(75) Inventors: David Vaclav Horak, Essex Junction, VT (US); Charles William Koburger, III, Essex Junction, VT (US); Peter H. Mitchell, Jericho, VT (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/454,852

(22) Filed: Jun. 5, 2003

(65) Prior Publication Data

US 2004/0245637 A1 Dec. 9, 2004

(51) Int. Cl.[7] .................... H01L 21/331; H01L 21/8222
(52) U.S. Cl. ...................... 438/319; 257/522; 257/758; 438/411; 438/619
(58) Field of Search ................................ 257/522, 758; 438/319, 411, 619

(56) References Cited

U.S. PATENT DOCUMENTS

| | | | |
|---|---|---|---|
| 5,828,121 A | | 10/1998 | Lur et al. |
| 6,057,224 A | | 5/2000 | Bothra et al. |
| 6,071,805 A | * | 6/2000 | Liu .............................. 438/619 |
| 6,204,165 B1 | * | 3/2001 | Ghoshal ...................... 438/619 |
| 6,211,561 B1 | * | 4/2001 | Zhao .......................... 257/522 |
| 6,268,261 B1 | | 7/2001 | Petrarca et al. |
| 6,413,827 B2 | * | 7/2002 | Farrar ......................... 438/296 |
| 6,555,467 B2 | * | 4/2003 | Hsu et al. .................... 438/633 |
| 6,713,835 B1 | * | 3/2004 | Horak et al. ................. 257/522 |

* cited by examiner

Primary Examiner—Allan R. Wilson
Assistant Examiner—Edgardo Ortiz
(74) Attorney, Agent, or Firm—Wood, Herron & Evans, LLP

(57) ABSTRACT

A method for forming interlevel dielectric levels in a multilevel interconnect structure formed by a damascene process. The conductive features characteristic of the damascene process are formed in a removable mandrel material for each level of the interconnect structure. In at least one level, a portion of the mandrel material underlying the bond pad is clad on all sides with the metal forming the conductive features to define a support pillar. After all levels of the interconnect structure are formed, the mandrel material surrounding the conductive features is removed to leave air-filled voids that operate as an interlevel dielectric. The support pillar is impermeable to the etchant such that mandrel material and metal inside the support pillar is retained. The support pillar braces the bond pad against vertical mechanical forces applied by, for example, probing or wire bonding and thereby reduces the likelihood of related damage to the interconnect structure.

32 Claims, 10 Drawing Sheets

METHOD FOR SUPPORTING A BOND PAD IN A MULTILEVEL INTERCONNECT STRUCTURE AND SUPPORT STRUCTURE FORMED THEREBY

FIELD OF THE INVENTION

The invention relates to the manufacture of integrated circuits and, more particularly, to a process for manufacturing multilevel interconnect structures for integrated circuits.

BACKGROUND OF THE INVENTION

Scaling down of active device dimensions in the manufacture of integrated circuits (IC's) has improved circuit performance and increased the functional capability of the active devices packed on a semiconductor substrate. The full benefit of such advances in active-device density may be realized only if the active devices are effectively interconnected. As the active device density increases and feature sizes shrink, the signal-transmission effectiveness and efficiency of the interconnect structure eventually limit the circuit performance and functional capability of an IC chip.

Multi-level interconnect structures have been developed that match the advances in active-device density by more effectively routing metallization lines between the active devices. In certain IC designs, five or more individual levels of metallization lines may be required to accommodate the active-device density. Multilevel interconnect structures arrange the metallization lines in multiple layers in which the metallization lines of each individual level are formed in an interlevel dielectric. The interlevel dielectric electrically isolates the metallization lines from one another in each level of the interconnect structure and electrically isolates metallization lines in adjacent levels.

Damascene processes are routinely used in back-end-of-line (BEOL) processing for fabricating multilevel interconnect structures. In a damascene process, trenches and vias are etched in a layer of an interlevel dielectric and filled with metal, such as copper (Cu) or a Cu-based alloy, to create metallization lines and vertical conductive paths between metallization lines in different levels. Copper has superior electromigration resistance and lower resistivity than other candidate metals, such as aluminum, considered for fabricating multilevel interconnect structures. Traditional subtractive etching approaches cannot form copper metallization lines because copper is difficult to etch. Therefore, damascene processes are particularly meaningful for fabricating copper metallization lines.

In a dual-damascene process, the interlevel dielectric layer is conformally covered by a blanket of metal that simultaneously fills the trenches and vias. Excess overburden metal is removed from the interlevel dielectric by a process such as chemical-mechanical polishing (CMP). Metal remaining in the trenches extends substantially horizontal relative to the substrate to define metallization lines, and metal remaining in the vias provides contacts between metallization lines in adjacent levels. A single-damascene process forms trenches and vias in distinct interlevel dielectric layers and fills each with a distinct blanket deposition of metal.

As the active-device density increases and feature sizes shrink, the line-to-line spacings between adjacent, on-pitch metallization lines in individual layers and between metallization lines in adjacent layers of the multi-level interconnect structure are reduced. Shrinking the line-to-line spacings increases the line-to-line capacitance, which slows the speed of the signals carried by the metallization lines and results in propagation delay.

Reducing the dielectric constant of the interlevel dielectric reduces the line-to-line capacitance. To that end, one trend in multilevel interconnect structures is to form the interlevel dielectric from a dielectric material characterized by a relative permittivity or dielectric constant less than the dielectric constant of silicon oxide or fluorinated silicon glass. Generally, such low-k dielectrics are characterized by a dielectric constant less than about four, which represents the dielectric constant of silicon oxide. Candidate low-k materials include spin-on low-k films, such as SILK commercially available from Dow Chemical Co. (Midland, Mich.), and chemical vapor deposition low-k films, such as organosilicates. The reduction in line-to-line capacitance afforded by low-k dielectrics permits adjacent metallization lines to be positioned closer together and thereby enable more effective circuit wiring for a given number of interconnect levels.

Damascene processes place stringent requirements on the properties of the material forming interlevel dielectric layer and, hence, on the candidate low-k dielectrics projected for use as an interlevel dielectric. The numerous requirements have limited the integration of low-k dielectrics into damascene processes for fabrication multilevel interconnect structures. In particular, low-k dielectrics must be compatible with the cleaning, etching, CMP and thermal treatments characteristic of a damascene manufacturing process. The low-k dielectric must have sufficient mechanical strength and chemical stability to withstand all the manufacturing processes.

An extremely low-k dielectric for forming multilevel interconnect structure is air, which has a dielectric constant of about unity. Mechanical strength is lent during processing by incorporating a removable or sacrificial material as a temporary interlevel dielectric and removing the sacrificial material after the levels of the multilevel interconnect structure are completed. The spaces formerly occupied by the sacrificial material are filled with air to form a freestanding latticework of metallization. Despite its attractiveness as a low-k dielectric, air lacks structural rigidity.

Multi-level interconnect structures include bond pads that represent relatively large metal areas distributed about the device side of the substrate. Bond pads are used to establish electrical contact between the integrated circuits and either a package or a probe pin. A probe is an instrument that makes an electrical contact of a probe pin with the bond pads so voltage or current can be applied to test for device functionality. Contact between the probe pin and bond pad can damage the metallization and interlevel dielectric of the underlying levels of an air-filled interconnect structure. For example, the probe pin can apply a vertical force to the bond pad of a magnitude that can crush or partially collapse the interconnect structure as the metallization itself lacks the strength to successfully resist the vertical force. The resulting damage compromises the quality of the interconnect structure and may create electrical shorts between metallization lines in adjacent levels.

Wire bonders attach small diameter bonding wires between the bond pads and a sealed package that provide a lead system for connecting the active devices to a printed circuit board or any other desired suitable external circuitry. The package also protects the IC from damage and from contaminants in the surrounding environment. The wire bonding process can cause damage to the underlying interconnect levels because the air-filled spaces surrounding the metallization lack mechanical strength.

A conventional approach for reinforcing the interconnect structure is to introduce a dense array or "sea" of metal-filled vias in one or more interconnect levels beneath each bonding pad or probe pad. To afford effective rigidity, the vias are vertically aligned beneath the bond pad and are present in several levels of the interconnect structure. However, the vias significantly restrict use of the space beneath the bond pad for metallization coupling active devices. In addition, allowed via densities in IC designs limit the potential strengthening effect. Therefore, this conventional approach has significant deficiencies.

What is needed, therefore, is a method and structure to reinforce bond pads in multilevel interconnect structures against a vertical force, such as is applied during probing and wirebonding.

SUMMARY OF THE INVENTION

In accordance with the principles of the invention, a method is provided for manufacturing a multi-level interconnect structure with structure support for a bond pad. Multiple wiring and via levels are formed by applying a mandrel material to a substrate, removing portions of the mandrel material where vias and wiring are required, and refilling the removed portions using damascene metal deposition and overburden removal. At a subsequent processing stage, the mandrel material is removed by etching, thereby forming air-filled inter-wire spaces of low dielectric constant. To minimize loss in structural strength below bond pads, fully-enclosed cores of mandrel material are protected against removal. The full-enclosed cores of mandrel material are protected by solid tubes of damascene metal. The tubes are capped above and below by having them intersect solid features spanning the tubes on adjacent layers made from the damascene metal or other similar impermeable material. The regions of fully-enclosed mandrel material remains intact and so provide vertical support to an overlying bond pad.

In a specific embodiment of the invention, a damascene pattern is formed by removing portions of a mandrel material applied to a substrate. The damascene pattern includes a closed channel surrounding a core of the mandrel material. The damascene pattern is filled with a conductive material to create a plurality of features having the mandrel material disposed between adjacent features and a support pillar defined by conductive material filling the closed channel and surrounding the core of the mandrel material. Mandrel material is removed between adjacent features to leave air-filled voids. The support pillar provides vertical support to an overlying bond pad that is electrically coupled with at least one of the features.

In accordance with the principles of the invention, a multilevel interconnect structure includes a plurality of damascene features filled by a conductive material and a bond pad electrically coupled with at least one of the plurality of damascene features. Adjacent pairs of the plurality of damascene features are separated by one of a plurality of air-filled voids. A support pillar underlying the bond pad includes a core of a mandrel material and a tubular outer layer formed of the conductive material that surrounds the mandrel material core. The outer layer protects the mandrel material in the core against an etchant used to remove regions of the mandrel material from between adjacent pairs of the plurality of damascene features to provide the plurality of air-filled voids.

In accordance with the principles of the invention, the support pillar is compatible with the use of a mandrel material as a sacrificial interlevel dielectric layer. In particular, the support pillars are easily integrated with single or dual damascene processes that rely on a removable mandrel material to form air-filled spaces between conductive features. The integration of the support pillars into the damascene process is accomplished with no additional process steps but, instead, merely minor adjustments to the lithography pattern used to define the vias and trenches in the damascene process steps.

The support pillar of the invention relies on the structural strength of the mandrel material for rigidity without the need for dense arrays of metal-filled vias, as is conventional. Therefore, less design restrictions are imposed on the space underlying the bond pad for metallization coupling active devices and the potential strengthening effect is not limited by allowed via densities in IC designs. The support pillars reinforce bond pads in multilevel interconnect structures against the application of external vertical forces, such as external vertical forces applied to the bond pad during probing and wirebonding. The structural reinforcement and strengthening prevent damage to the metallization in the various levels of the interconnect structure at locations beneath bond pads.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

The invention is directed to manufacturing a multi-level interconnect structure for an integrated circuit having air as the interlevel dielectric electrically isolating individual metallization levels. According to the principles of the invention, a support pillar is introduced into one or more levels of the interconnect structure at a location beneath a bond pad. The conductive features of the interconnect structure are formed by a damascene process in a mandrel material, which replaces the interlevel dielectric during the fabrication of the interconnect structure and is later removed except under bond pads. The support pillar is constituted by a core of the mandrel material that is clad by metal. The same process steps that form the damascene features form the support pillar.

Figure 1A:
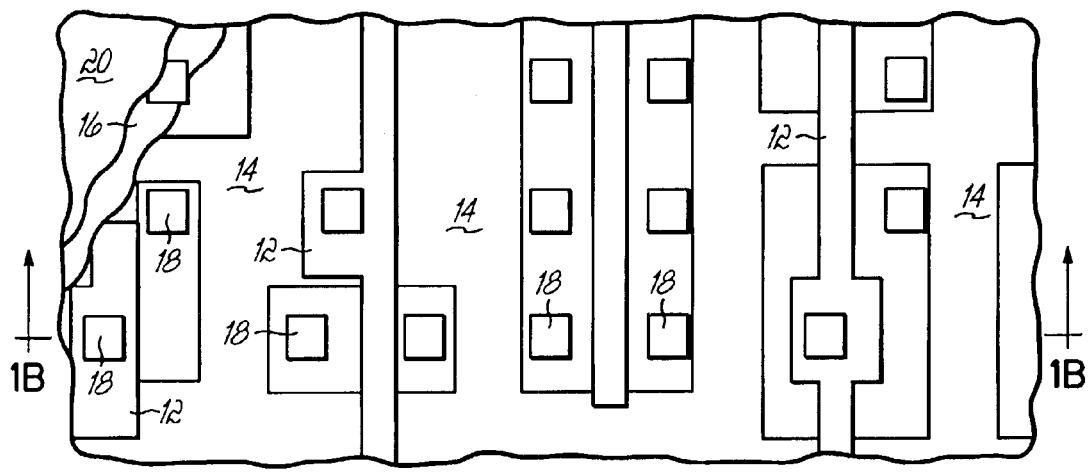
FIG. 1A is a top view of a portion of a substrate.
Figure 1B:
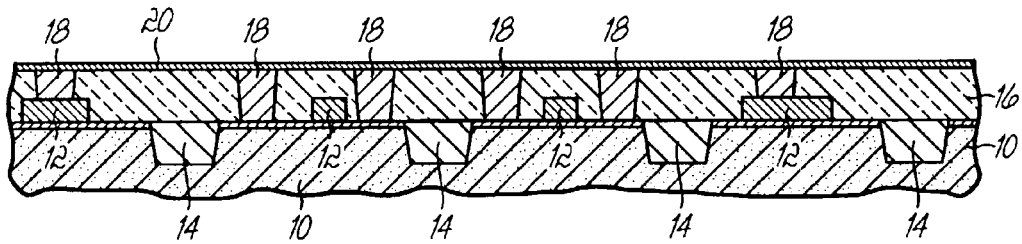
FIG. 1B is a cross-sectional view taken generally along lines 1B—1B in FIG. 1A.

With reference to FIGS. 1A and 1B, a portion of a substrate 10 includes regions such as gate conductors 12 of field effect transistors (FET's) and shallow trench isolation (STI) structures 14. Substrate 10 may be any suitable semiconductor substrate material, including but not limited to silicon and gallium arsenide, upon which or within which active devices may be formed by front-end-of-line (FEOL) processes. An insulating layer 16 constituted by a material of relatively high electrical resistivity, such as borophosphosilicate glass (BPSG), is deposited on the substrate 10 as a pre-metal dielectric. The exposed surface of the insulating layer 16 is polished flat and planarized by a chemical-mechanical polishing (CMP) process or any other suitable planarization technique. Generally, CMP processes involve a polishing or mechanical abrasion action aided chemically by a slurry introduced between a polishing pad and the substrate 10.

Contacts 18 are provided by forming contact openings in the insulating layer 16 by a standard lithographic and etch process, introducing a conductive material, such as tungsten, by a blanket deposition that fills the contact openings, and removing the excess overburden of conductive material down to the insulating layer 16 by any suitable planarization technique, such as a CMP process. An etch stop layer 20, typically ranging from about 10 nm to about 50 nm in thickness, is then formed on the polished surface. The etch stop layer 20 may be composed of any of several different materials, such as silicon nitride or silicon oxide, deposited by conventional physical vapor deposition or chemical vapor deposition techniques.

Figure 2:
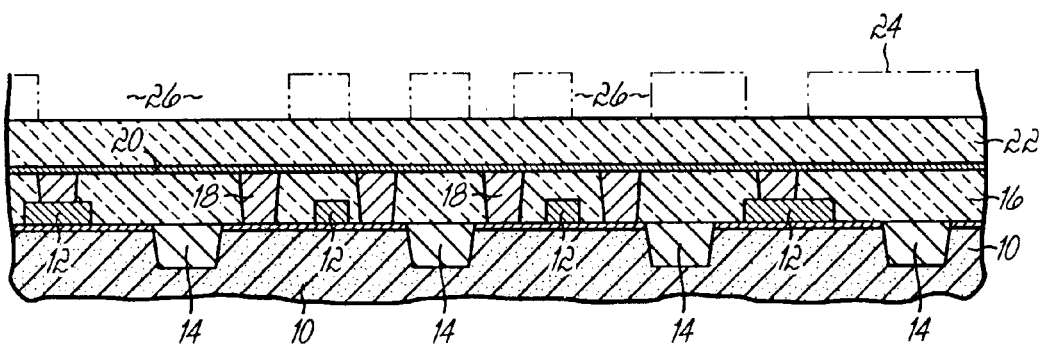
FIG. 2 is a cross-sectional view similar to FIG. 1B at a subsequent fabrication stage.

With reference to FIG. 2, a mandrel layer 22 is deposited on the etch stop layer 20. As will be discussed below, the mandrel layer 22 represents disposable or removable sacrificial material removed by a subsequent processing step. Generally, the mandrel layer 22 has a thickness between approximately 100 nm and approximately 1000 nm. The mandrel layer 22 may be deposited by any conventional deposition technique, including but not limited to chemical vapor deposition and physical vapor deposition. In a single conventional lithographic operation, a resist layer 24 is applied to the mandrel layer 22, exposed to impart a latent image trench pattern, and developed to transform the latent image pattern into a final image pattern having unmasked areas 26 that expose mandrel layer 22 at the future locations of trenches 28, 29 (FIGS. 3A, B).

Figure 3A:
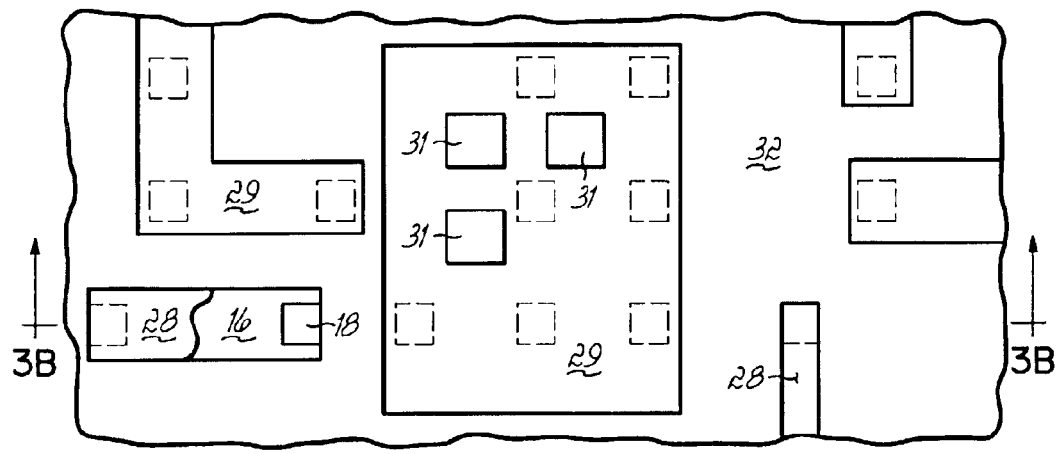
FIG. 3A is a top view similar to FIG. 1A at a subsequent fabrication stage.
Figure 3B:
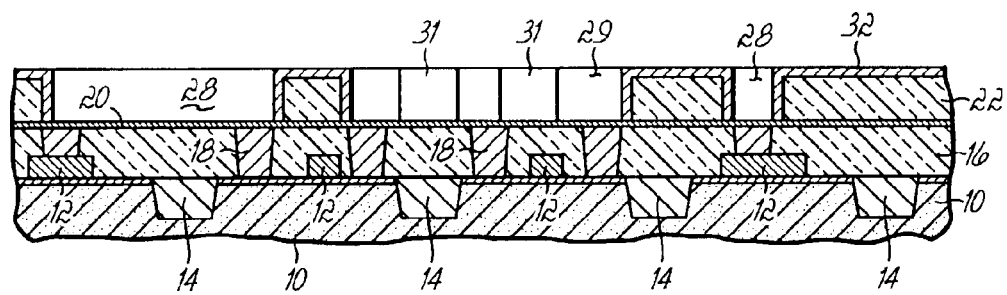
FIG. 3B is a cross-sectional view taken generally along lines 3B—3B in FIG. 3A.

With reference to FIGS. 3A and 3B, the trenches 28, 29 are formed in the mandrel layer 22 using a conventional etch operation that removes portions of mandrel layer 22 in unmasked areas 26 by any etching process, such as anisotropic etching (e.g., plasma etching or reactive ion etching), suitable for producing substantially vertical trench sidewalls. The trenches 28, 29 defined in the mandrel layer 22 extend vertically to the horizontal level of the etch stop layer 20.

Figure 18A:
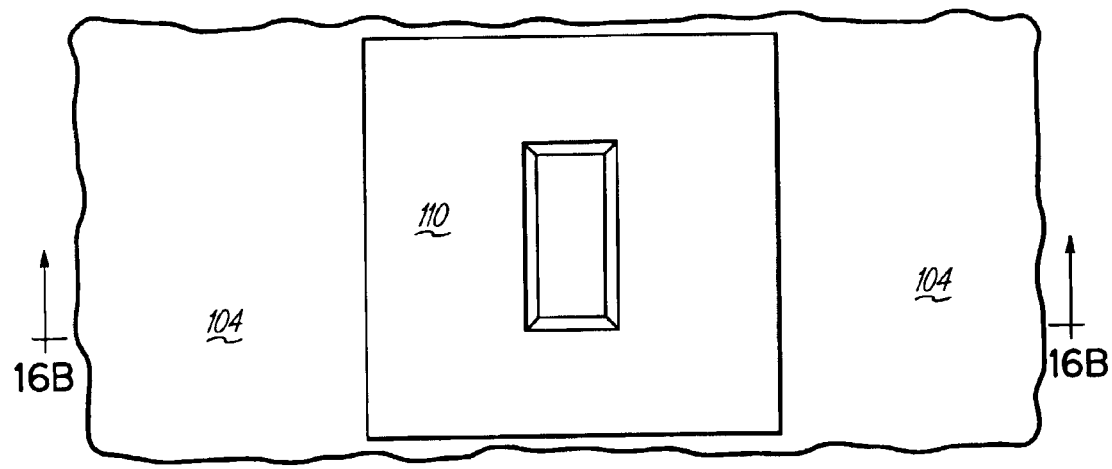
FIG. 18A is a top view similar to FIG. 14A at a subsequent fabrication stage.

Trench 29 is destined to be filled with metal and underlie a subsequently manufactured bond pad 110 (FIGS. 18A, B). To that end, trench 29 is drawn in the resist layer 24 to completely surround the perimeter of a lower cap 40 (FIGS. 5A, B) formed when trench 29 is filled with metal during a subsequent fabrication stage. Cheesing areas 31 are drawn in the resist layer 24 within a perimeter defined by trench 29 to protect isolated islands of mandrel material during the etching process that defines trenches 28, 29. Mandrel material resident in cheesing areas 31 reduces topographical variations, such as dishing, of the metal filling the interior of trenches 29 during subsequent polishing steps as the mandrel material is harder than the metal. The patterned resist layer 24 is stripped after trenches 28, 29 and cheesing areas 31 are formed.

The term "horizontal" as used herein is defined as a plane parallel to the conventional plane or surface of substrate 10, regardless of orientation. The term "vertical" refers to a direction perpendicular to the horizontal, as just defined. Terms, such as "on", "above", "below", "side" (as in "sidewall"), "higher", "lower", "over", and "under", are defined with respect to the horizontal plane.

After the trenches 28, 29 have been defined, the exposed surfaces of the mandrel layer 22 are covered by a thin oxide layer 32 grown, for example, by low temperature plasma oxidation. A typical thickness for oxide layer 32, which may be silicon oxide, is about 10 nm to about 50 nm. Oxide layer 32 may be omitted without departing from the spirit and scope of the invention.

Figure 4:
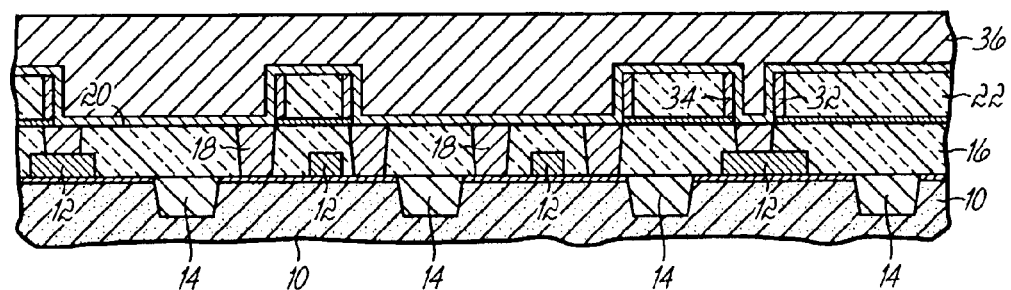
FIG. 4 is a cross-sectional view similar to FIG. 3B at a subsequent fabrication stage.

With reference to FIG. 4, areas of the etch stop layer 20 exposed by the definition of trenches 28, 29 are removed by etching, such as by plasma or reactive ion etching, to permit the establishment of electrical contact with the contacts 18. Areas of the oxide layer 32 on the horizontal surfaces of the mandrel layer 22 are also removed by wet or dry etching. An adhesion-promoting barrier liner 34 is then applied to the horizontal and vertical surfaces of the trenches 28, 29. Typical materials suitable for liner 34 include titanium, titanium nitride, tantalum, tantalum nitride, other refractory metals, metal nitrides, and combinations of the same. A seed layer (not shown) may be applied over the liner 34 to promote subsequent electrodeposition of a conductive material, such as copper or a copper alloy.

Next, a conductive layer 36 of a metal, such as copper or a copper alloy, is blanket deposited conformally on substrate 10 by a suitable deposition technique, such as by plating with electroless or electroplating techniques. Alternatively, the conductive layer 36 may be deposited by physical vapor deposition or chemical vapor deposition. After the blanket deposition of the conductive layer 36, metal fills the trenches 28, 29, with the exception of cheesing areas 31 inside the perimeter of trench 29 that remain filled with mandrel material originating from mandrel layer 22, and overburdens the patterned remnants of mandrel layer 22. If necessary, the substrate 10 may be heat treated to anneal the metal of conductive layer 36 before subsequent process steps. In particular, annealing copper increases the grain size to improve electromigration reliability and promote bonding with liner 34.

Figure 5A:
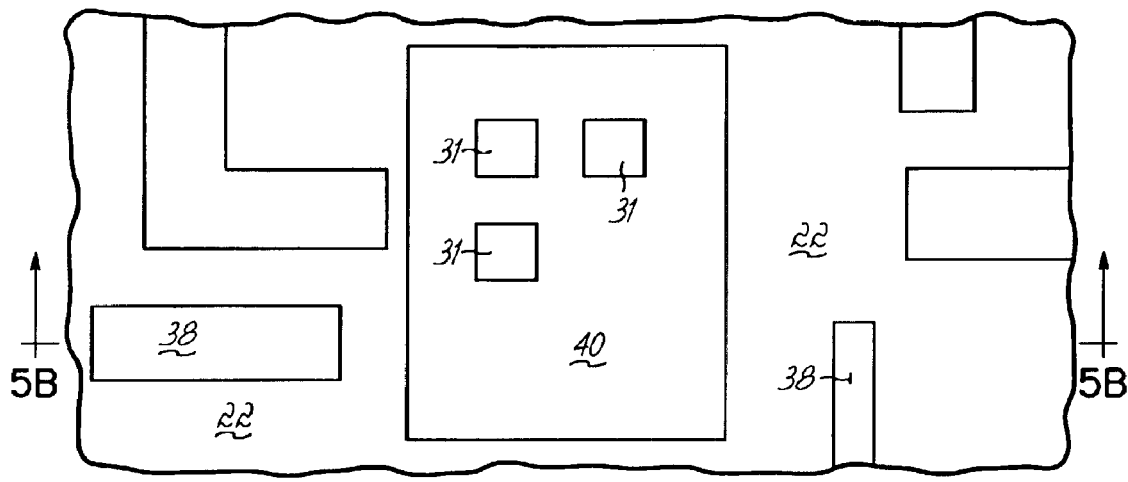
FIG. 5A is a top view similar to FIG. 3A at a subsequent fabrication stage.
Figure 5B:
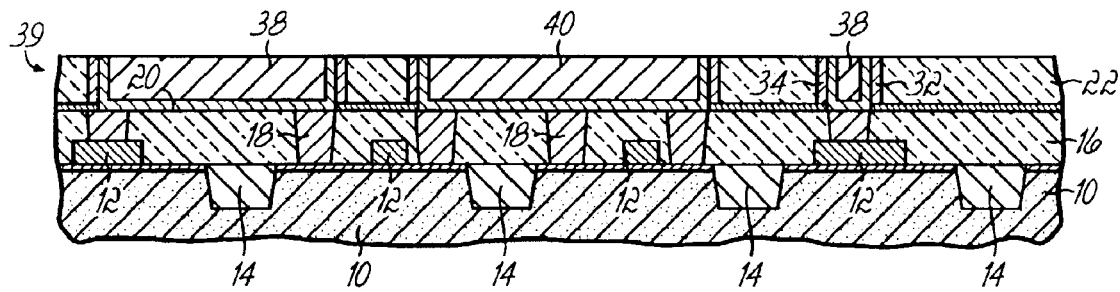
FIG. 5B is a cross-sectional view taken generally along lines 5B—5B in FIG. 5A.

With reference to FIGS. 5A and 5B, excess metal from conductive layer 36 (FIG. 4), portions of the liner 34 present on the mandrel layer 22, and portions of any oxide layer 32 present on the mandrel layer 22 are removed by any suitable planarization technique, such as a CMP process, stopping at the horizontal level of the trenches 28, 29 to provide a planarized surface. Material of the mandrel layer 22 generally operates as a polishing stop layer for CMP processes. Inlaid metal originating from conductive layer 36 that fills trenches 28 defines conductive features 38 surrounded by the material of mandrel layer 22. Conductive features 38 define a first level, generally indicated by reference numeral 39, of a multilevel interconnect structure 70 (FIGS. 18A, B).

Figure 11:
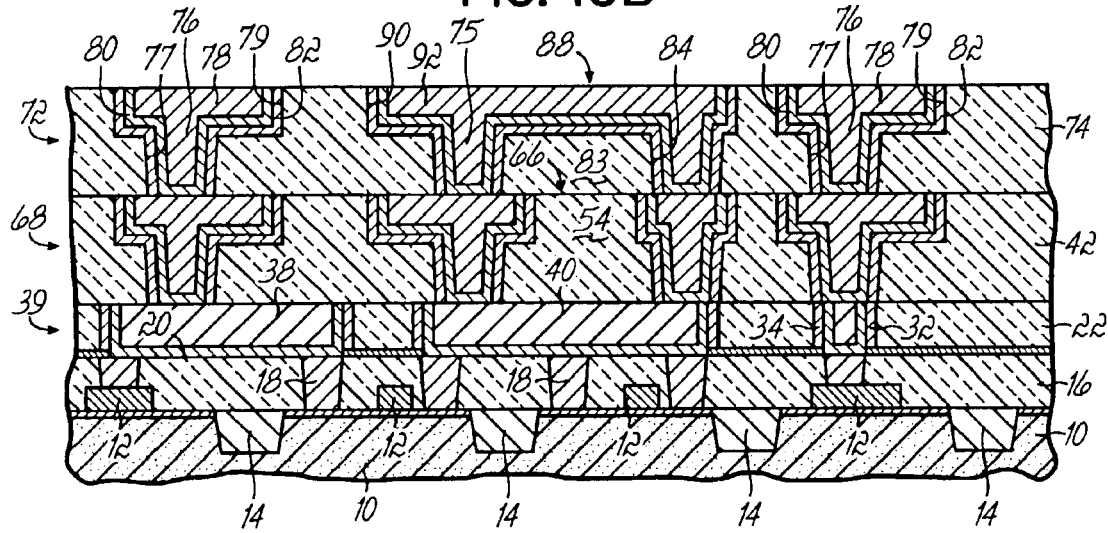
FIGS. 11–13 are cross-sectional views similar to FIG. 10B at subsequent manufacturing stages.

Inlaid metal originating from conductive layer 36 also fills trench 29 and defines the lower cap 40, which is surrounded on all lateral sides by the material of mandrel layer 22. Cheesing areas 31 (FIG. 5A) present inside the outer perimeter of trench 29 are filled by mandrel material. Cheesing areas 31 may be omitted so that, after the conductive layer 36 is deposited and planarized, lower cap 40 is formed in its entirety of metal to protect mandrel material in at subsequent overlying levels from removal by chemical attack from below. Alternatively, if underlying substrate 10 and etch stop layer 20 are impermeable to the isotropic etchant 100 (FIG. 13) employed to remove portions of the mandrel material to create the air dielectric, then cheesing areas 31 may be utilized without risk of leaving a fluid pathway to the pillar portions 42a (FIGS. 7A, 7B), 83 (FIG. 11).

Figure 6:
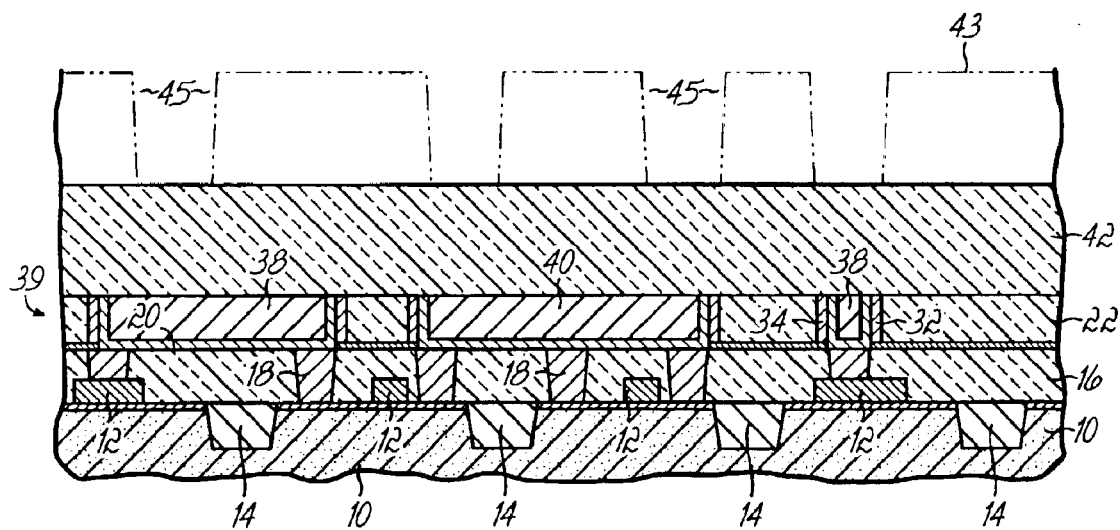
FIG. 6 is a cross-sectional view similar to FIG. 5B at a subsequent fabrication stage.

With reference to FIG. 6, another mandrel layer 42 is deposited on the planarized surface. A typical thickness for the mandrel layer 42 is between about 100 nm and about 1500 nm, preferably about 1200 nm. The mandrel layer 42 may be deposited by any conventional deposition technique, including but not limited to chemical vapor deposition and physical vapor deposition, compatible with depositing the material forming layer 42. In a single conventional lithographic operation, a resist layer 43 is applied to the mandrel layer 42, exposed to impart a latent image via pattern, and developed to transform the latent image pattern into a final image pattern having unmasked areas 45 that expose mandrel layer 42 at the future locations of vias 46, 48 (FIGS. 7A, B).

Figure 7A:
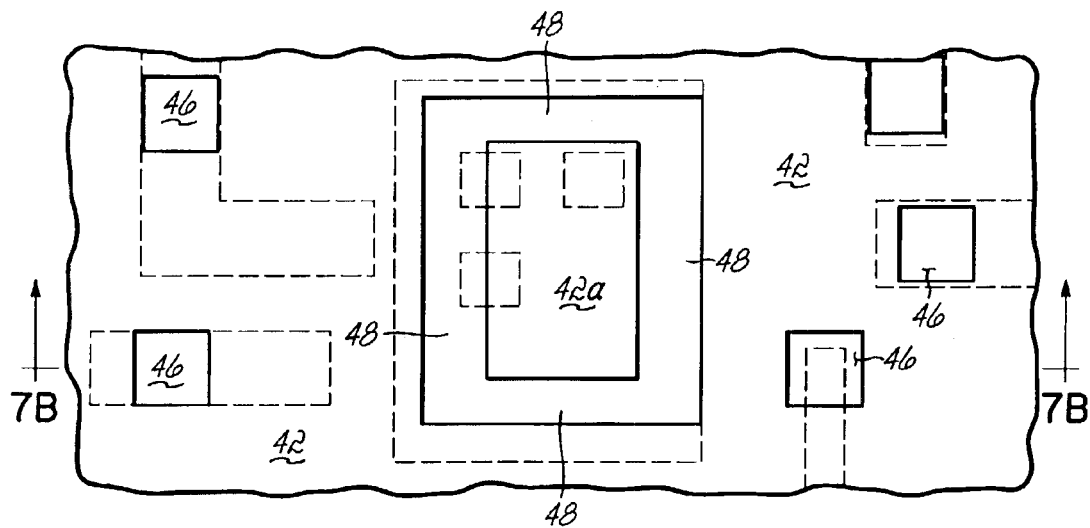
FIG. 7A is a top view similar to FIG. 5A at a subsequent fabrication stage.
Figure 7B:
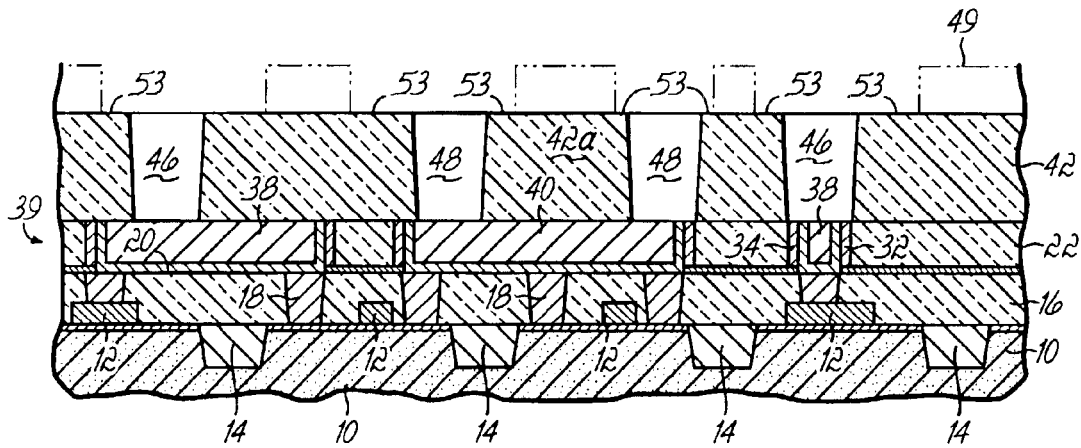
FIG. 7B is a cross-sectional view taken generally along lines 7B—7B in FIG. 7A.

With reference to FIGS. 7A and 7B, the vias 46, 48 are formed in the mandrel layer 42 using a conventional etch operation in which portions of mandrel layer 42 are removed in unmasked areas 45 (FIG. 6) by any etching process, such as anisotropic etching (e.g., plasma etching or reactive ion etching), capable of producing substantially vertical via sidewalls. The vias 46, 48 defined in the mandrel layer 42 extend substantially vertically to the horizontal level of the conductive features 38 and lower cap 40. Vias 48 are bar vias that define a closed path encircling a pillar portion 42a of the mandrel layer 42. After vias 46, 48 are defined, the patterned resist layer 43 is stripped. The closed path defined by vias 48 overlaps with the outer perimeter of lower cap 40 so that fluid pathways to the pillar portion 42a and the cheesing areas 31 are absent.

Another resist layer 49 is applied to the mandrel layer 42, exposed to impart a latent image pattern characteristic of trenches 50, 51 (FIGS. 8A, B), developed to transform the latent image pattern into a final image pattern having unmasked areas 53 that expose mandrel layer 42 at the future locations of trenches 50, 51. The pattern also incorporates cheesing areas 54 (FIGS. 8A, B) drawn in the patterned resist layer 49 inside of trenches 51 that cover isolated islands of the mandrel material of pillar portion 42a. Similar to cheesing areas 31 (FIG. 5A), mandrel material resident in cheesing areas 54 reduces topographical variations, such as dishing, of the metal filling the interior of trenches 51 during subsequent polishing steps as the mandrel material is harder than the metal. The closed path defined of trenches 51 overlaps with the vias 48 so that fluid pathways to the pillar portion 42a and the cheesing areas 54 are absent.

Figure 8A:
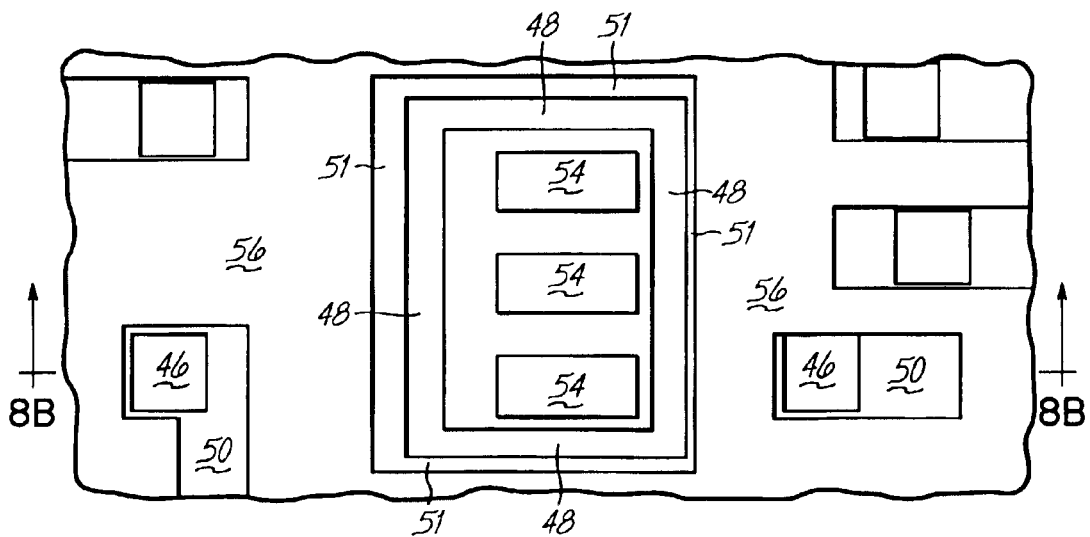
FIG. 8A is a top view similar to FIG. 7A at a subsequent fabrication stage.
Figure 8B:
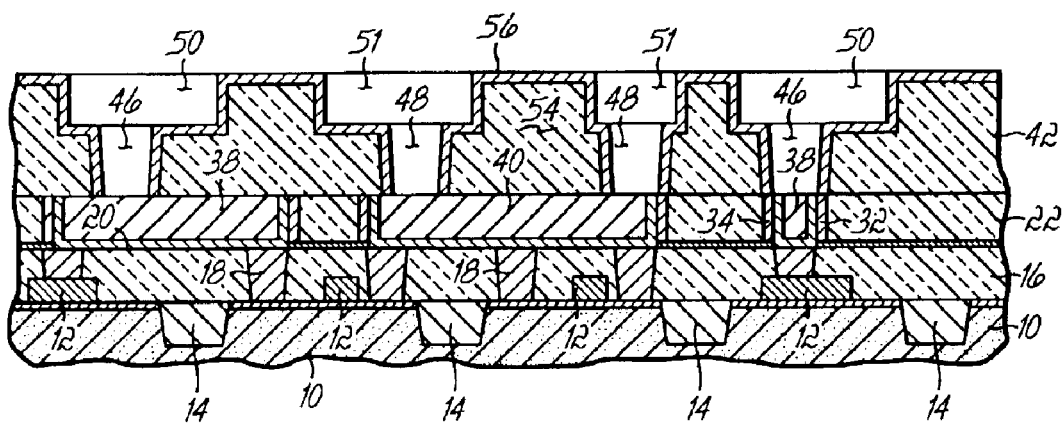
FIG. 8B is a cross-sectional view taken generally along lines 8B—8B in FIG. 8A.

With reference to FIGS. 8A and 8B, trenches 50, 51 are provided in the mandrel layer 42 by etching with any suitable etching process, such as anisotropic etching (e.g., plasma etching or reactive ion etching), that produces substantially vertical trench sidewalls, to remove material from mandrel layer 42 in unmasked areas 53 and form trenches 50, 51. Mandrel material inside pillar portion 42a, but outside of the cheesing areas 54, is removed to the same vertical depth as the trenches 50, 51. Mandrel material of pillar portion 42a in the cheesing areas 54 is not removed. After trenches 50, 51 are defined, the patterned resist 49 is stripped.

Trenches 50 are generally aligned vertically with the vias 46 so that the vias 46 underlie the trenches 50. Collectively, the vias 46 and the trenches 50 define a damascene pattern. Similarly, trenches 51 are aligned vertically with the vias 48 and encircle the pillar portion 42a of the mandrel layer 42 so that vias 48 and trenches 51 define a closed channel circumscribing the pillar portion 42a and the cheesing areas 54. Cheesing areas 54, which represent volumes of mandrel material of pillar portion 42a, lie entirely inside an outer perimeter defined by trench 51. The exposed horizontal and vertical surfaces of the mandrel layer 42 are covered by a thin oxide layer 56, which may be silicon oxide, grown, for example, by low temperature plasma oxidation. Oxide layer 56 may be omitted without departing from the spirit and scope of the invention.

The invention contemplates that vias 46, 48 may be formed after trenches 50, 51, rather than before trenches 50, 51, without departing from the spirit and scope of the invention. The ability to perform these damascene process steps in either order is familiar to persons of ordinary skill in the art of semiconductor device fabrication.

Figure 9:
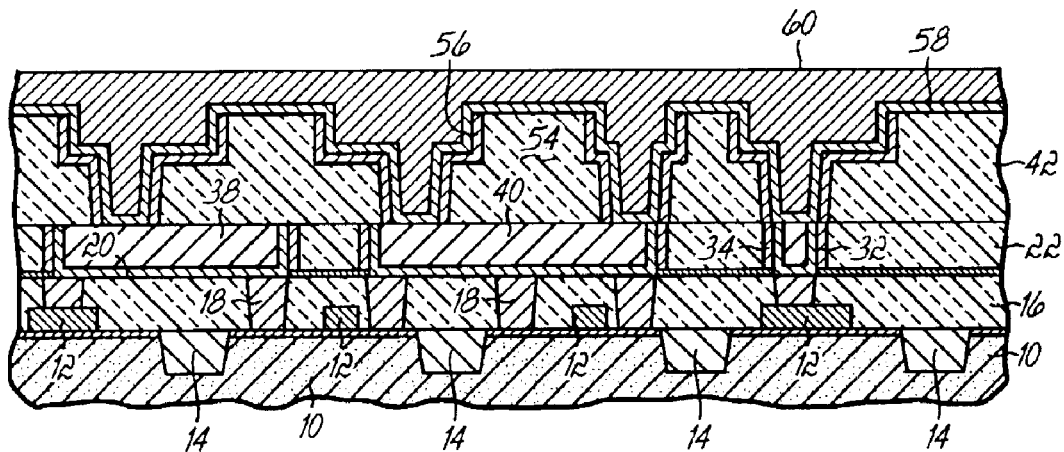
FIG. 9 is a cross-sectional view similar to FIG. 8B at a subsequent fabrication stage.

With reference to FIG. 9, an adhesion-promoting barrier liner 58 is applied to the horizontal and vertical surfaces of the vias 46, 48 and trenches 50, 51. Typical materials suitable for liner 58 include titanium, titanium nitride, tantalum, tantalum nitride, other refractory metals, metal nitrides, and combinations of the same. A seed layer (not shown) may be applied over the liner 58 to promote subsequent deposition of a conductive material, such as copper or a copper alloy, if deposited by electroplating. Next, a conductive layer 60 of a metal, such as copper (Cu) or a copper alloy, is blanket deposited on substrate 10. The metal of conductive layer 60 fills vias 46, 48 and trenches 50, 51 and overburdens the patterned remnants of mandrel layer 42. If necessary, the substrate 10 may be heat treated to anneal the metal of conductive layer 60 before subsequent process steps. In particular, annealing copper increases the grain size to improve electromigration reliability and promote bonding with liner 58.

Figure 10A:
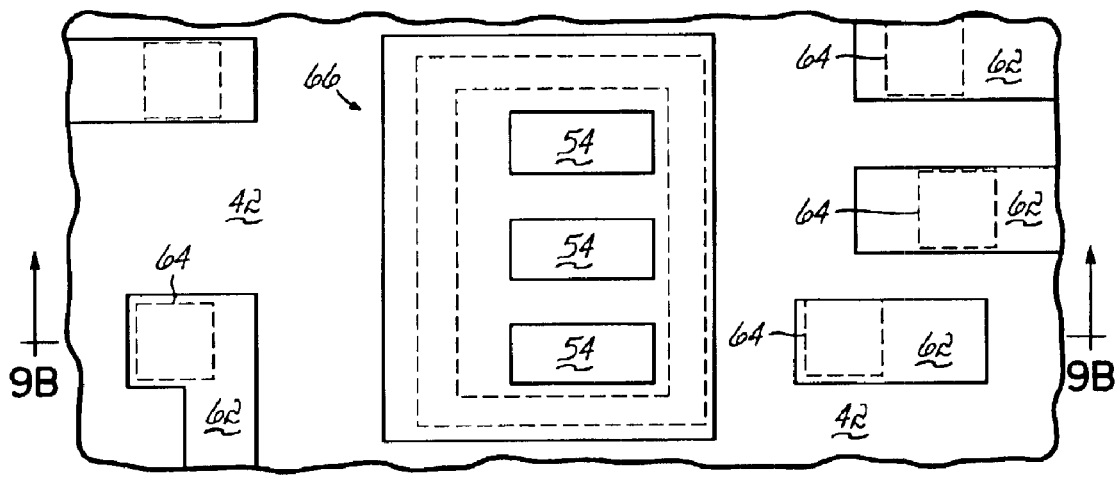
FIG. 10A is a top view similar to FIG. 8A at a subsequent fabrication stage.
Figure 10B:
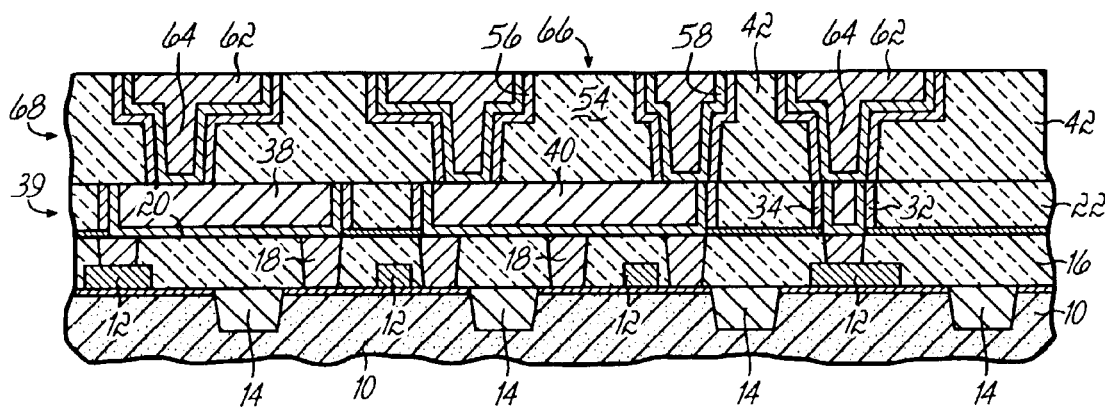
FIG. 10B is a cross-sectional view taken generally along lines 10B—10B in FIG. 10A.

With reference to FIGS. 10A and 10B, excess metal in conductive layer 60, portions of the liner 58, and portions of any oxide layer 56 on the mandrel layer 42 that project above the upper horizontal level of trenches 50, 51 are removed by any suitable planarization technique, such as a CMP process, to provide a planarized surface. The mandrel layer 42 acts as a polishing stop layer. Inlaid metal within the trenches 50 (FIGS. 8A,B) defines conductive lines 62 surrounded by the material of mandrel layer 42 and the inlaid metal within the vias 46 (FIGS. 8A,B) defines conductive plugs 64. The conductive lines 62 and conductive plugs 64 constitute features characteristic of damascene processes.

The resulting structure defines a second level, generally indicated by reference numeral 68, of a multilevel interconnect structure 70 (FIGS. 18A, B). The conductive plugs 64 and conductive lines 62 interconnect active devices and conductive lines in other levels of the interconnect structure 70. In particular, each of the conductive plugs 64 is in electrical contact at its lower end with one of the conductive features 38 and in electrical contact at its upper end with one of the conductive lines 62.

Inlaid metal within vias 48 and trenches 51 and mandrel material in pillar portion 42a defines a support pillar 66 that is surrounded by the material of mandrel layer 42. The support pillar 66 has a closed perimeter and a coextensive contact with the lower cap 40, which may be considered to form a portion of the support pillar 66. The mandrel material disposed in the cheesing areas 54 at the vertical level of the trench 51 constitutes a portion of the support pillar 66 along with the inlaid metal in trench 51. Therefore, the support pillar 66 includes an outer shell of metal and a composite core of mandrel material and metal. The invention contemplates that the cheesing areas 54 may be increased dimensionally to be contiguous such that, after the conductive layer 36 is applied, a metal sidewall encircles a solid core of mandrel material to define support pillar 66. Alternatively, the cheesing areas 54 may be omitted by modifying trench 29 to have the appearance of an unfilled rectangle so that, after the conductive layer 36 is deposited and planarized, the support pillar 66 is formed of metal to the depth of the trenches 51 and of mandrel material from the depth of trenches 51 to the depth of vias 48.

Alternatively, normal wiring patterns instead of cheesing areas 54 may be placed within the pillar portion 42 of mandrel material because trenches 51 and vias 48 completely protect pillar portion 42a laterally and connect to similarly impermeable materials above and below.

With reference to FIG. 11, the sequence of FIGS. 6–10 is repeated to fabricate additional levels of the multilevel interconnect structure 70 that replicate level 68. For example, a third interconnect level, generally indicated by reference numeral 72, is added to the structure in FIG. 11. Although FIG. 11 illustrates the multilevel interconnect structure 41 as having three individual levels 39, 68, 72, the invention is not so limited as additional levels similar to levels 68 and 72 may be added to multilevel interconnect structure 70 as mandated by the IC chip design and active device density.

The third interconnect level 72 includes a mandrel layer 74 surrounding conductive plugs 76 defined by metal from a conductive layer, generally indicated by reference numeral 75, filling vias 77 in mandrel layer 74, conductive lines 78 defined by metal from conductive layer 75 filling trenches 79 in mandrel layer 74, a liner 80 for the conductive plugs 76 and conductive lines 78, and an oxide layer 82, which may be omitted without departing from the spirit and scope of the invention. The conductive plugs 76 and conductive lines 78 constitute features characteristic of damascene processes. Collectively, the vias 77 and the trenches 79 define a damascene pattern.

Level 72 further includes a support pillar 88 defined by inlaid metal in vias 84, the mandrel material of a pillar portion 83 of mandrel layer 74 surrounded by inlaid metal in vias 84, inlaid metal present in trenches 90, and inlaid metal and mandrel material from pillar portion 83 present in any cheesing areas (not shown) surrounded by inlaid metal in trenches 90. Collectively, the inlaid metal and mandrel material surrounded by vias 84 and trenches 90 constitute a core. Generally, support pillar 88 has a closed perimeter and overlaps support pillar 66 to provide a closed, fluid-tight junction that prevents horizontal infiltration of isotropic etchant 100 (FIG. 13) into the core at the interface between the support pillars 66, 88. Support pillar 88 is aligned vertically with support pillar 66 and is surrounded on all sides by the mandrel material of mandrel layer 74. Portions of liner 80 and oxide layer 82 encapsulate the sidewalls of support pillar 88. Inlaid metal in a volume defined by trenches 90 defines an upper cap 92. In an alternative embodiment, the invention contemplates a hybrid integration for principles of the invention that introduces the support pillars 66, 88 beneath the bond pad 110 (FIGS. 18A, B) in only the upper levels of the multilevel interconnect structure, as required to provide the needed support. The support pillars 66, 88 are localized within the multilevel interconnect structure 70 and, as such, are not present at locations within the levels 68, 72 of interconnect structure 70 other than at locations beneath bond pad 110 or similar bond pads.

In an alternative embodiment, cheesing areas may be omitted from the upper cap 92 if cap 92 is impermeable to isotropic etchant 100 (FIG. 13) to prevent infiltration into the core. In another alternative embodiment, the size of the cheesing areas may be increased such that, after the conductive layer 36 is applied, the support pillar 88, over its entire vertical extent, is constituted by a metal sidewall encircling a solid core of mandrel material, if an upper protective layer or cap is applied over the support pillar 88 during a subsequent process step to prevent the infiltration or ingress of isotropic etchant 100 (FIG. 13) into the core.

In an alternative embodiment, the invention contemplates a hybrid integration for principles of the invention that introduces the pillar as an interlevel dielectric at upper levels of the multilevel interconnect structure and relies on a conventional low-k dielectric, such as a spin-on low-k film or a chemical vapor deposition low-k film, in lower levels vertically below the levels from which the mandrel material is removed.

The mandrel layers 22, 42 and 74 are formed from any material capable of being removed by a wet or dry chemical etch process selective to the other materials in the completed multi-level interconnect structure 70. Specifically, the etch process must be selective to the metal filling the vias and trenches of the damascene structure, the liner imposed between the mandrel layer and the metal, and any other materials, including but not limited to silicon oxide and silicon nitride, of the multilevel interconnect structure 70 exposed to the etch process. In particular, the material forming the mandrel layers 22, 42 and 74 is removable selective to the metal and liner filling the vias and trenches so that a protective barrier layer is not required.

Preferred materials for mandrel layers 22, 42 and 74 are amorphous silicon, amorphous germanium and amorphous silicon germanium. Amorphous silicon is etchable, for example, in a wet chemical etchant consisting of a solution of potassium hydroxide, which etches the mandrel layers 22, 42, and 74 selective to copper, the copper liner, and other common exposed materials on the substrate, such as silicon oxide, silicon nitride, and titanium. Amorphous silicon is conventionally produced by thermal chemical vapor deposition (CVD) using a silicon-yielding precursor, such as silane ($SiH_4$), as a reactant gas, by low pressure chemical vapor deposition (LPCVD) using a silicon-yielding precursor as a reactant gas, by plasma-enhanced chemical vapor deposition (PECVD) using a silicon-yielding precursor as a reactant gas, or by techniques of physical vapor deposition (PVD). Amorphous germanium, which is etchable in a solution containing hydrogen peroxide, may be formed by similar CVD methods using a germanium-yielding precursor, such as germane ($GeH_4$), as a reactant gas or by a PVD technique. Amorphous silicon germanium may be deposited by a CVD process using a reactant gas mixture, such as germane and silane, or by PVD using a target material of a suitable composition.

Figure 12:
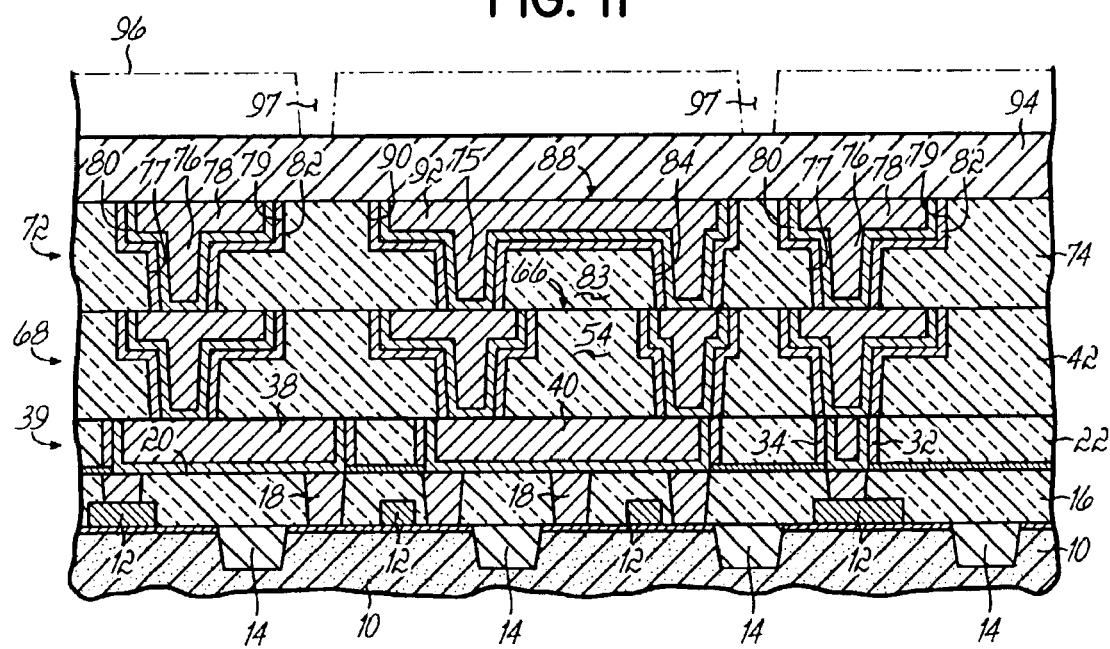

With reference to FIG. 12, an insulating layer 94 of, for example, silicon oxide, silicon nitride or a combination of these two materials, is deposited on the planarized exposed surface of the uppermost level 72 of the multilevel interconnect structure 70. A resist layer 96 is applied to the insulating layer 94, exposed to impart a latent image pattern having unmasked areas 97 on insulating layer 94 that are characteristic of a set of passageways 98 (FIG. 13), and developed to transform the latent image pattern into a final image pattern having unmasked areas that expose insulating layer 94 at the future locations of passageways 98.

Figure 13:
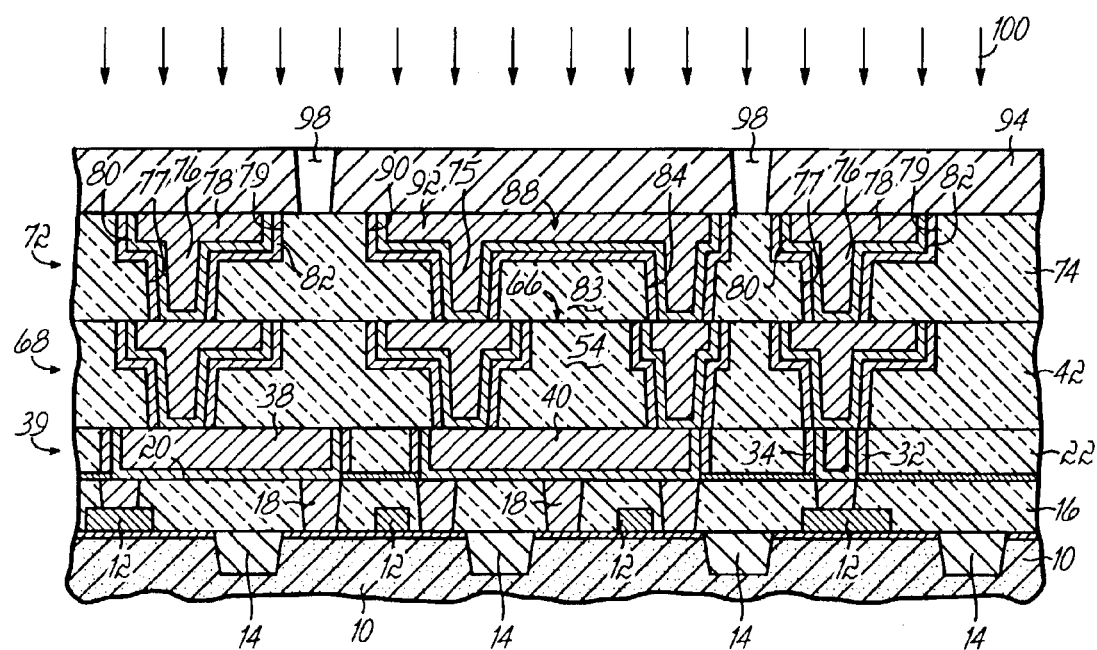

With reference to FIG. 13, the insulating layer 94 is etched by any suitable etching process, such as anisotropic etching (e.g., plasma etching or reactive ion etching), that produces substantially vertical via sidewalls, to remove material from insulating layer 94 in unmasked areas 97 to form passageways 98. The passageways 98 extend through the insulating layer 94 but not through the metal of upper cap 92. The passageways 98 extend toward the substrate 10 to define unobstructed discrete pathways that permit fluid access to mandrel layers 22, 42 and 74. If upper cap 92 is not a solid pattern, then passageways 98 should not intersect mandrel material of pillar portion 83 inside support pillar 88.

An isotropic etchant, generally indicated by reference numeral 100, is introduced into the passageways 98 for removing the mandrel layers 22, 42, and 74. The isotropic etchant 100 may be introduced by either a wet chemical process or a gaseous chemical process. Typically, isotropic etchant 100 is applied over the entire substrate 10, such as by immersing the substrate 10 in a liquid chemical bath containing isotropic etchant 100. The isotropic etchant 100 etches the material forming the mandrel layers 22, 42 and 74, preferably equally in all directions at the same rate. The substrate 10 is exposed to isotropic etchant 100 until the mandrel layers 22, 30 and 50 are removed. The byproducts from the etched mandrel material are dissolved in the isotropic etchant 100 and exit the interconnect structure 70 through the passageways 98.

The support pillars 66, 88 and caps 40, 92 are closed to the infiltration of the isotropic etchant 100 so that mandrel material in cheesing areas 31, 54 and pillar portions 42a, 83 is not eroded by the chemical action of isotropic etchant 100. The passageways 98 are positioned laterally relative to the support pillars 66, 88 and caps 40, 92 so that fluid pathways are not created into the interior of the support pillars 66, 88. The isotropic etchant 100 selectively etches the mandrel material outside of the support pillars 66, 88 without etching the mandrel material and metal forming the pillar portions 42a, 83.

Figure 14A:
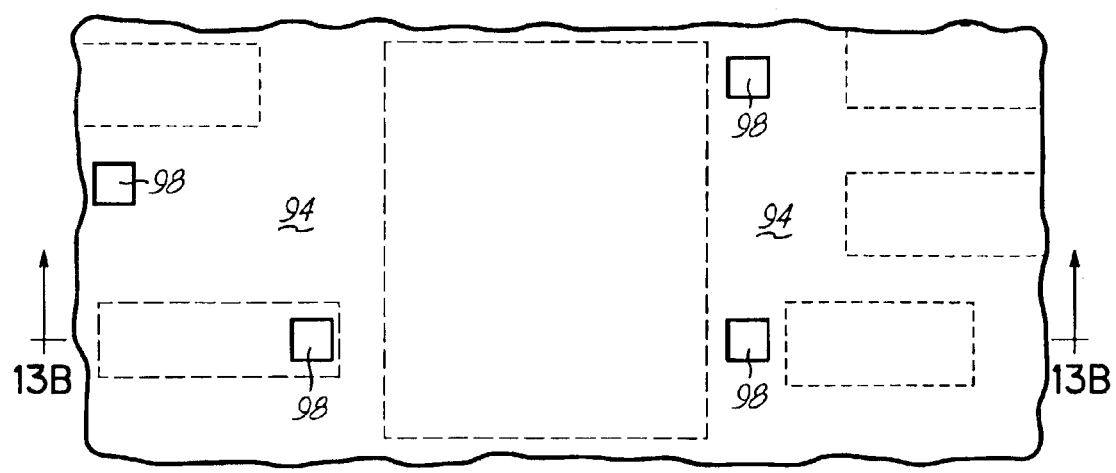
FIG. 14A is a top view similar to FIG. 10A at a subsequent fabrication stage.
Figure 14B:
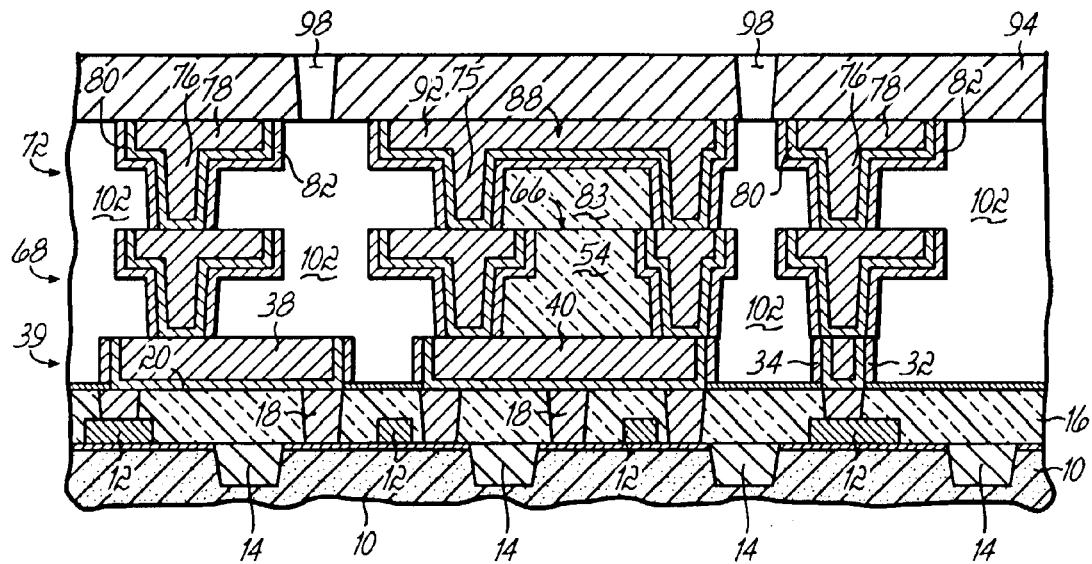
FIG. 14B is a cross-sectional view taken generally along lines 14B—14B in FIG. 14A.

With reference to FIGS. 14A and 14B, the chemical action of the etchant 100 (FIG. 13) dissolves and removes the material forming the mandrel layers 22, 42, and 74, while the materials forming barrier layer 20, oxide layers 32, 56, and 82, liners 34, 58 and 80, conductive layers 36, 60, and 75, and insulating layer 94 are not significantly modified. Air voids 102 define a volumetric space formerly occupied by the material of mandrel layers 22, 42, and 74 and now filled by air having a dielectric constant of about unity, which furnishes a low-k dielectric material. The air voids 102 electrically isolate conductive features 38, conductive plugs 64, conductive lines 62, conductive plugs 76, and conductive lines 78 from among themselves. The air dielectric furnishes a low-k interlevel dielectric effective for lowering the line-to-line capacitance.

Figure 15:
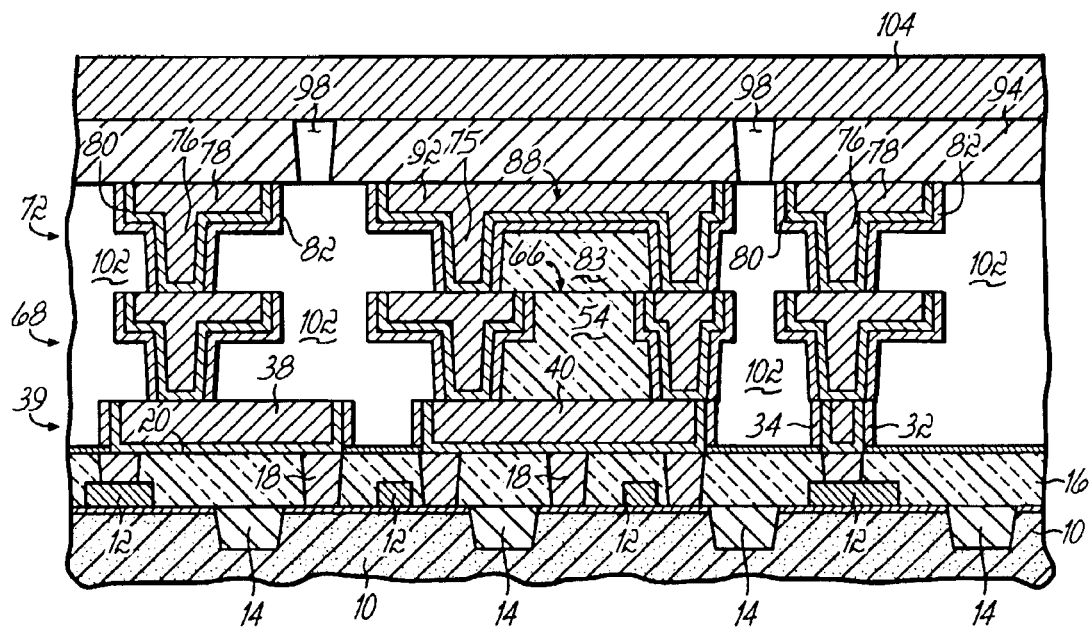
FIGS. 15—17 are cross-sectional views similar to FIG. 14B at subsequent manufacturing stages.
Figure 16:
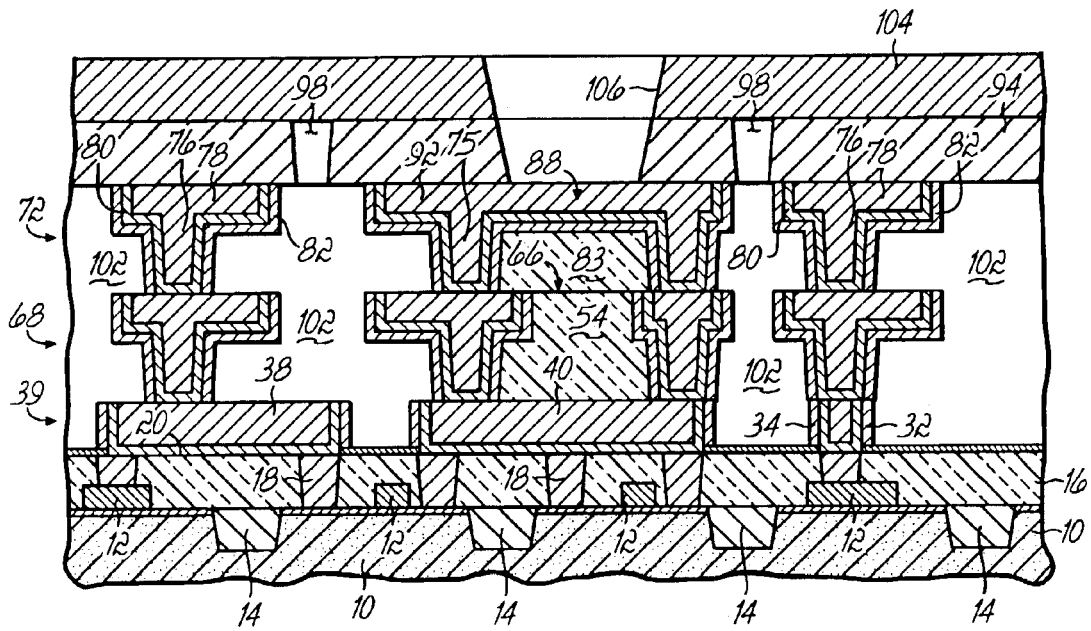

With reference to FIGS. 15 and 16, an insulating layer 104 constituted by one or more dielectric materials, such as silicon oxide or silicon nitride, is deposited on insulating layer 94. Portions of the insulating layer 104 seal the passageways 98. Vias 106 are formed in the insulating layers 94, 104 using conventional lithographic and etch techniques. The vias 106 extend vertically to the horizontal plane of conductive lines 78, 92.

Figure 17:
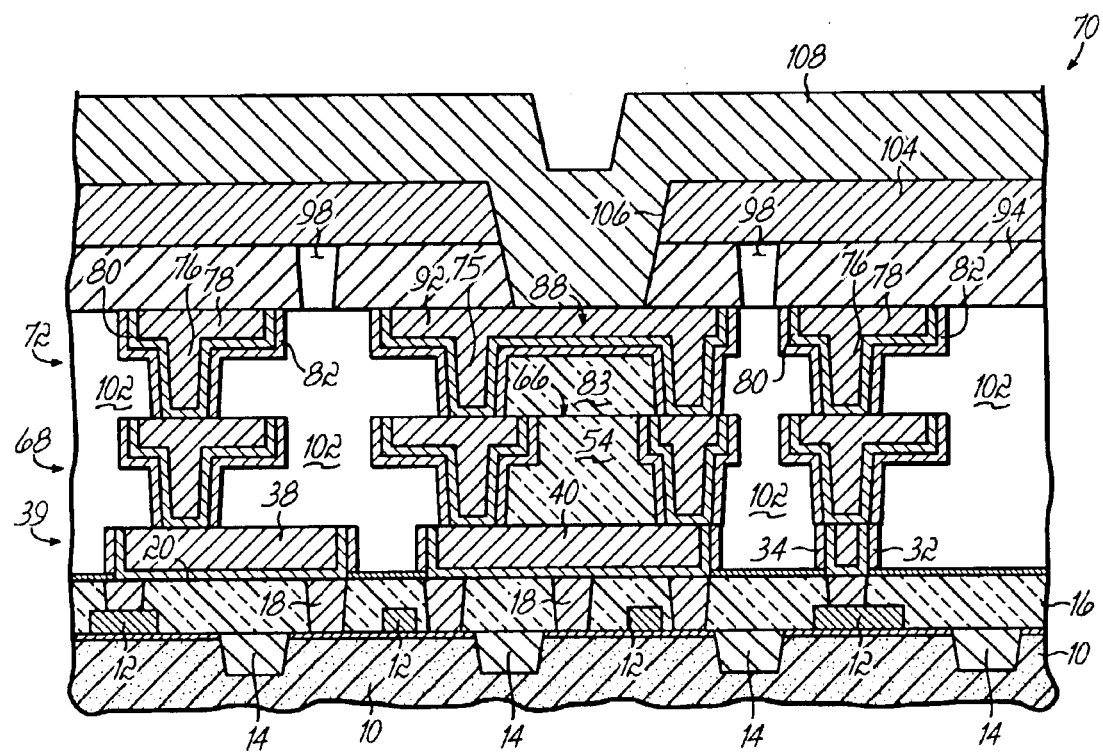

With reference to FIG. 17, a conductive layer 108 is blanket deposited on the insulating layer 104. The conductive layer 108 is formed of a metal having a relatively high electrical conductivity, such as aluminum or an aluminum-based alloy. The metal filling vias 106 define conductive plugs 108.

Figure 18B:
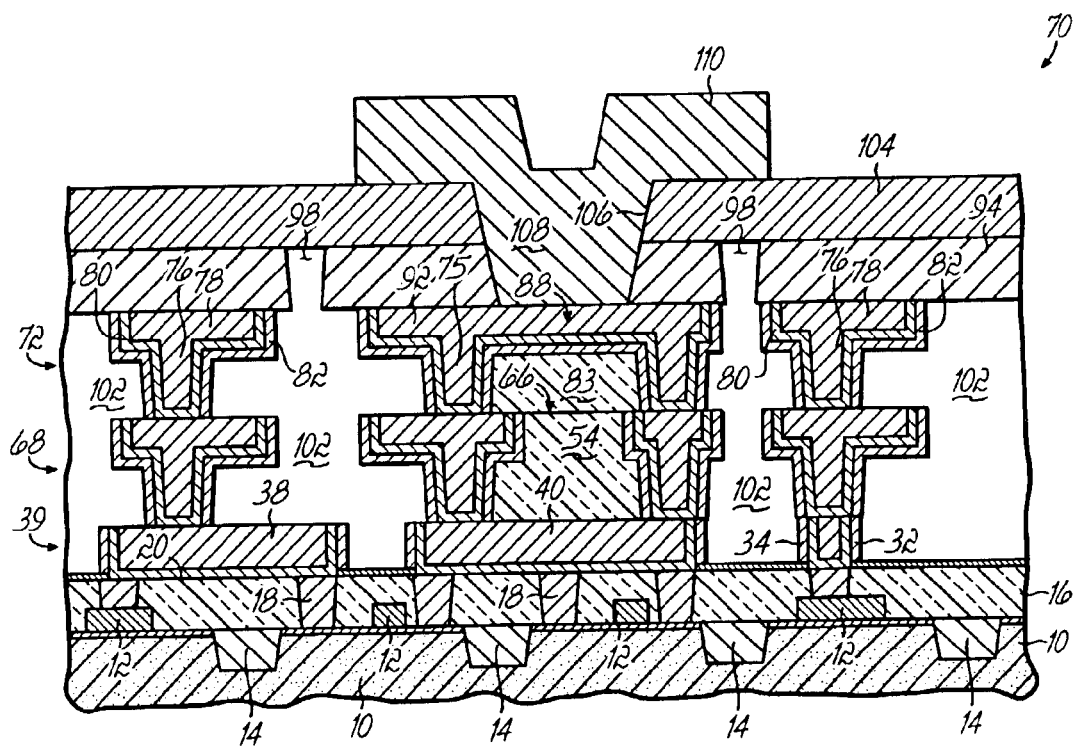
FIG. 18B is a cross-sectional view taken generally along lines 18B—18B in FIG. 18A.

With reference to FIGS. 18A and 18B, conductive layer 108 is patterned using conventional subtractive lithographic and etch techniques to form conductive wiring lines (not shown) and a bond pad 110. The bond pad 110 overlies the support pillars 66, 88, which provide mechanical strength and load-bearing support if the bond pad 110 is probed or if the bond pad 110 is wirebonded. The support pillars 66, 88 do not provide an electrical path among interconnect levels. The support pillars 66, 88 have a cross-sectional area, viewed vertically, similar to the cross-sectional area of the bond pad 110. A layer of an encapsulant (not shown), such as polyimide, may be applied to seal the exposed surface and removed to expose the bond pad 110, which is electrically coupled with at least one of the conductive lines 78, 92.

Thus, while the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for manufacturing a multi-level interconnect structure with structural support for a bond pad, comprising:

applying a mandrel material to a substrate;

forming a damascene pattern in the mandrel material by removing portions of the mandrel material, the damascene pattern including a closed channel surrounding a core of the mandrel material;

filling the damascene pattern with a conductive material to create a plurality of features having the mandrel material disposed between adjacent features and a support pillar defined by conductive material filling the closed channel and surrounding the core of the mandrel material; and removing the mandrel material between adjacent features to leave air-filled voids between adjacent features, the support pillar providing vertical support to an overlying bond pad that is electrically coupled with at least one of the features.

2. The method of claim 1 wherein forming the damascene pattern in the mandrel material further comprises partially removing the mandrel material to form vias, trenches opening onto the underlying vias, and the closed channel.

3. The method of claim 2 wherein filling the damascene pattern with the conductive material further comprises introducing the conductive material into vias, trenches, and the closed channel with a single deposition of conductive material.

4. The method of claim 2 wherein removing the mandrel material to form trenches and a portion of the closed channel is performed by a single lithographic and etch operation.

5. The method of claim 2 wherein removing the mandrel material to form vias and a portion of the closed channel is performed by a single lithographic and etch operation.

6. The method of claim 1 wherein the conductive material is copper and the mandrel material is selected from the group consisting of amorphous silicon, amorphous germanium, and amorphous silicon-germanium.

7. The method of claim 6 wherein removing the mandrel material from between adjacent features further comprises exposing the mandrel material to an isotropic etchant capable of removing the mandrel material selective to copper.

8. The method of claim 7 wherein the isotropic etchant is capable of removing the mandrel material selective to titanium, titanium nitride, tantalum, tantalum nitride, silicon oxide, silicon nitride, and aluminum.

9. The method of claim 1 wherein removing the mandrel material from between adjacent features further comprises exposing the mandrel material to an isotropic etchant.

10. The method of claim 9 wherein the mandrel material is amorphous silicon and the isotropic etchant contains potassium hydroxide.

11. The method of claim 9 wherein the mandrel material is amorphous germanium and the isotropic etchant contains potassium hydroxide.

12. The method of claim 9 further comprising:
forming at least one layer overlying the features, the mandrel material between adjacent features, and the support pillar, wherein the layer prevents vertical infiltration of the isotropic etchant into the core of the mandrel material within the support pillar.

13. The method of claim 9 further comprising forming a cap of the conductive material on the substrate underlying the support pillar, the cap closing the core of the support pillar to vertical infiltration of the isotropic etchant.

14. The method of claim 9 wherein forming the damascene pattern in the mandrel material further comprises etching the core of the support pillar so that the conductive material at least partially covers an upper surface of the core to define a cap closing the core of the support pillar to vertical infiltration of the isotropic etchant.

15. The method of claim 1 further comprising performing a polishing process to expose an upper surface of the mandrel material between adjacent features so that the conductive material only remains within the damascene pattern and the closed channel.

16. The method of claim 1 wherein removing the mandrel material from between adjacent features further comprises:
forming at least one layer overlying the features and the mandrel material between adjacent features;
defining at least one passageway through the layer leading to the mandrel material between adjacent features; and
introducing an isotropic etchant into the passageway for selectively etching the mandrel material relative to at least the conductive material for leaving the air void between adjacent features.

17. The method of claim 16 wherein the isotropic etchant is not admitted into the core of the support pillar.

18. The method of claim 17 wherein the layer prevents vertical infiltration of the isotropic etchant into the core of the mandrel material.

19. The method of claim 1 further comprising forming a bond pad overlying the support pillar and electrically coupled with at least one of the features.

20. The method of claim 1 wherein filling the damascene pattern with the conductive material further comprises creating at least one of the plurality of features inside the core of the mandrel material.

21. A multilevel interconnect structure comprising:
a plurality of damascene features filled by a conductive material, adjacent pairs of the plurality of damascene features separated by one of a plurality of air-filled voids;
a bond pad electrically coupled with at least one of said plurality of damascene features; and
a support pillar underlying said bond pad, said support pillar including a core of a mandrel material and a tubular outer layer formed of the conductive material, said outer layer surrounding said core of said mandrel material for protecting said core against an etching used to remove regions of said mandrel material from between adjacent pairs of said plurality of damascene features to provide said plurality of air-filled voids.

22. The multilevel interconnect structure of claim 21 wherein said conductive material is selected from the group consisting of copper and copper alloys.

23. The multilevel interconnect structure of claim 21 wherein said support pillar further includes a cap underlying said outer layer and said core, said cap joined in a fluid tight manner with said outer layer.

24. The multilevel interconnect structure of claim 23 wherein said cap contains a portion of said conductive material.

25. The multilevel interconnect structure of claim 24 wherein said cap further contains a portion of said mandrel material.

26. The multilevel interconnect structure of claim 25 further comprising an insulating layer overlying said cap, said insulating layer cooperating with said cap to protect said core against the etchant used to remove regions of said mandrel material from between adjacent pairs of the plurality of damascene features.

27. The multilevel interconnect structure of claim 23 wherein said cap contains one or more materials impervious to the etchant.

28. The multilevel interconnect structure of claim 21 wherein said support pillar further includes a cap overlying said outer layer and said core, said cap joined in a fluid tight manner with said outer layer.

29. The multilevel interconnect structure of claim 29 wherein said cap contains said conductive material.

30. The multilevel interconnect structure of claim 29 wherein said cap further contains said mandrel material.

31. The multilevel interconnect structure of claim 30 further comprising an insulating layer underlying said cap, said insulating layer cooperating with said cap to protect said core against the etching process used to remove regions of said mandrel material from between adjacent pairs of the plurality of damascene features.

32. The multilevel interconnect structure of claim 31 wherein said mandrel material is selected from the group consisting of amorphous silicon, amorphous germanium, and amorphous silicon-germanium.

* * * * *